(12) United States Patent
Mussi et al.

(10) Patent No.: US 10,812,090 B2
(45) Date of Patent: Oct. 20, 2020

(54) ULTRA-LOW POWER, REAL TIME CLOCK GENERATOR AND JITTER COMPENSATION METHOD

(71) Applicant: STMicroelectronics S.r.l., Agrate Brianza (MB) (IT)

(72) Inventors: Giorgio Mussi, Melzo (IT); Giacomo Langfelder, Milan (IT); Carlo Valzasina, Gessate (IT); Gabriele Gattere, Castronno (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 16/681,469

(22) Filed: Nov. 12, 2019

(65) Prior Publication Data

US 2020/0169262 A1   May 28, 2020

(30) Foreign Application Priority Data

Nov. 26, 2018   (IT) .......................... 102018000010577

(51) Int. Cl.
*H03L 7/099*   (2006.01)
*H03K 3/353*   (2006.01)
*H03K 5/00*   (2006.01)
*H03L 7/18*   (2006.01)

(52) U.S. Cl.
CPC ........... *H03L 7/0992* (2013.01); *H03K 3/353* (2013.01); *H03K 5/00006* (2013.01); *H03L 7/18* (2013.01)

(58) Field of Classification Search
CPC ......... H03L 7/0992; H03L 7/18; H03K 3/353; H03K 5/00006
See application file for complete search history.

(56) References Cited

U.S. PATENT DOCUMENTS

| 2006/0056561 | A1* | 3/2006 | Zhang | ..................... H03L 7/087 375/376 |
| 2007/0008040 | A1  | 1/2007 | Mayer et al. | |
| 2009/0039968 | A1* | 2/2009 | Thomsen | ................ H03L 1/022 331/10 |

(Continued)

FOREIGN PATENT DOCUMENTS

WO   2013006231 A2   1/2013

OTHER PUBLICATIONS

Hegazi, E., "A 17-mW Transmitter and Frequency Synthesizer for 900-MHz GSM Fully Integrated in 0.35-μm CMOS," IEEE Journal of Solid-State Circuits, May 2003, pp. 782-792, vol. 38, No. 5, IEEE.

(Continued)

*Primary Examiner* — Freshteh N Aghdam
(74) *Attorney, Agent, or Firm* — Slater Matsil, LLP

(57) ABSTRACT

In an embodiment, a clock generator has a variable-modulus frequency divider that receives a high-frequency clock signal and outputs a divided clock signal having a frequency controlled by a modulus-control signal generated by a temperature-compensation circuit. A jitter filter is coupled to the output of the variable-modulus frequency divider and to the temperature-compensation circuit and generates a compensated clock signal having switching edges that are delayed, with respect to the divided clock signal, by a time correlated to a quantization-error signal.

20 Claims, 7 Drawing Sheets

(56) References Cited

U.S. PATENT DOCUMENTS

| | | | | |
|---|---|---|---|---|
| 2013/0021069 A1* | 1/2013 | Tsangaropoulos | ...... | G06F 1/025 |
| | | | | 327/115 |
| 2014/0139293 A1* | 5/2014 | Tsangaropoulos | ...... | H03L 1/022 |
| | | | | 331/48 |
| 2014/0176201 A1 | 6/2014 | Weltin-Wu et al. | | |

OTHER PUBLICATIONS

Zaliasl, S., "A 3 ppm 1.5 ×0.8 mm$^2$ 1.0 µA 32.768 kHz MEMS-Based Oscillator," IEEE Journal of Solid-State Circuits, Jan. 2015, pp. 291-302, vol. 50, No. 1, IEEE.

* cited by examiner

ULTRA-LOW POWER, REAL TIME CLOCK GENERATOR AND JITTER COMPENSATION METHOD

CROSS-REFERENCE TO RELATED APPLICATIONS

This application claims priority to Italian Application No. 102018000010577, filed on Nov. 26, 2018, which application is hereby incorporated herein by reference.

TECHNICAL FIELD

The present disclosure relates generally to an electronic system and method, and, in particular embodiments, to an ultra-low power (ULP), real time clock (RTC) generator and jitter compensation method.

BACKGROUND

As is known, RTC generators are commonly used with clock function within electronic apparatus, whether portable or not, such as mobile phones, video or photo cameras, automotive apparatus, electrical household appliances, data-collection terminals, smart-card readers, etc., in order to count time even when the corresponding electronic apparatus are off. For this reason, it is frequently desirable for the above RTC generators to operate at low power, and thus have low consumption levels.

Generally, an RTC generator comprises a resonator, for generating an operating frequency equal to or a multiple of a desired value, for example 32.768 kHz, and an electronic module, coupled to the resonator, for counting time on the basis of the operating frequency.

Even though quartz technology has for decades dominated the field of frequencies generation (also for applications such as RTC), in recent times MEMS resonators have been proposed, with ever greater success, manufactured using semiconductor technologies, in particular of silicon.

In fact, MEMS resonators are distinguished by a marked dimension containment and by a considerable cost reduction by virtue of the possibility of exploiting standard processes for manufacturing integrated circuits. They thus enable low-cost integration of both the micromechanical structure and the corresponding electronic processing circuit (for example, an ASIC (Application-Specific Integrated Circuit). Moreover, MEMS resonators are generally more resistant to impacts and mechanical stresses.

MEMS resonators include resonant micromechanical structures manufactured using micromachining techniques, which, as a result of external stresses (including appropriate DC electrical biasing and AC driving signals), are induced to vibrate at a natural resonance frequency thereof. Resonant micromechanical structures typically comprise at least one mobile mass, anchored to a substrate by suitable constraint elements and driven with a resonant movement by the applied biasing and driving signals.

For instance, FIG. 1 shows the block diagram of an RTC generator 1 comprising a MEMS resonator 2 and an electronic processing circuit 3 that may be formed by an ASIC.

The electronic processing circuit 3 generally comprises an amplifier stage (not illustrated, including, for example, a current-to-voltage converter stage with gain Gm, feedback-connected to the resonant micromechanical structure) receiving the sensing signal and converting it into a resonance frequency signal.

The electronic processing circuit in general also comprises an output stage, coupled to the output of the amplifier stage of the MEMS resonator and configured to supply an output signal at the operating frequency and having the desired value.

The MEMS resonator 2 and the electronic processing circuit 3 may each be manufactured in a respective die of semiconductor material, in particular silicon, and be accommodated within a same package for defining an integrated system (chip).

In this type of clock generator, the stability of the frequency of the output signal is an important aspect in so far as it directly represents the figure of merit of the device.

However, the resonance frequency of a MEMS resonator is directly proportional to the square root of the Young's modulus of the material of the mobile mass of the resonant micromechanical structure, which varies as a function of the temperature. For instance, FIG. 2 shows the relative variation of frequency $\Delta f/f$ as a function of the temperature typical of RTC generators.

A wide range of solutions have been proposed in an attempt to solve the problem of the variation of the resonance frequency with temperature. There may, however, be improved so as to obtain low jitter, together with low area occupation (footprint) and reduced consumption levels.

For instance, a known solution is described in the paper "A 3 ppm 1.5×0.8 mm$^2$ 1.0 μA 32.768 kHz MEMS-Based Oscillator" by S. Zaliasl et al., IEEE Journal of Solid-State Circuits, Vol. 50, No. 1, January 2015. The clock generator described in this paper comprises a MEMS resonator and a temperature-compensation circuit, and is represented by the block diagram of FIG. 3.

In detail, the clock generator of FIG. 3 comprises a resonant micromechanical structure 10, a current-to-voltage converter stage 11 having gain Gm, connected to the resonant micromechanical structure 10 and generating a resonant signal HFCK at the resonance frequency; a temperature-compensation circuit 12, receiving the resonant signal HFCK and a compensation code COD and generating a compensated clock signal CLKO; a code generator 13, generating the compensation code COD; and an output drive circuit 14.

The temperature-compensation circuit 12 described in the above paper comprises a fractionary phase-locked loop (PLL), including a frequency divider 16 with variable modulus that divides the resonant signal HFCK by a value N or N+1 based on a control signal (modulus-control signal MC) supplied by a delta-sigma modulator 17 and controls a PLL circuit 18.

The code generator 13 is here of a programmable type, and comprises a multiplexer 20 that supplies the delta-sigma modulator 17, as a compensation code COD, either a constant value K (for example, set in the factory and supplied by a block 21) or a value correlated to the temperature T detected by a detection block 22.

The modulus-control signal MC generated by the delta-sigma modulator 17 represents the mean value of the frequency deviation of the divided clock signal CLK_D with respect to the nominal value.

In use, the frequency divider 16 divides the resonant signal HFCK by N to obtain the desired output frequency (divided clock signal CLK_D), except when the modulus-control signal MC requires a division by N+1; in this case, the frequency divider 16 lengthens the duration of the period of the divided clock signal CLK_D (see also the plots of FIG. 4 on the purely illustrative hypothesis that N=4).

In practice, the division by the factor N or N+1 on the part of the frequency divider 16 causes, only on average, the frequency of the divided clock signal CLK_D to be equal to the nominal frequency, but causes each switching of the divided clock signal CLK_D to occur at an instant different from the nominal one. Consequently, the divided clock signal CLK_D is affected by a high jitter, much higher than the one introduced by electronic or thermomechanical noise.

To reduce the jitter of the divided clock signal CLK_D, the above paper uses the PLL circuit 18 that filters the divided clock signal CLK_D and outputs a filtered clock signal CLKO, represented also in FIG. 4.

Use of the PLL circuit 18 entails the use of a voltage-controlled oscillator (VCO), which works at multiples of the frequency of the filtered clock signal CLKO. Consequently, the known solution has high consumption levels and is difficult to use in devices and apparatus that are portable and/or have a low power supply.

Moreover, it uses large sized components, implementation whereof entails a high area consumption. Also for this reason, it is not easy to use in portable devices and apparatus having small sizes and, in any case, increases the costs of the apparatus. On the other hand, the existing solutions that enable design of PLL circuits so as to reduce considerably the size of these components lead to a corresponding increase of design complexity.

SUMMARY

Some embodiments provide a clock generator that overcomes the drawbacks of the prior art.

Some embodiments relate to an ultra-low power, real time clock generator that uses a microelectromechanical system (MEMS) resonator.

According to some embodiments, a clock generator and a method for generating a clock signal are provided, e.g., as defined in the attached claims.

In some embodiments, the clock generator and the corresponding method start from the consideration that the jitter on the output signal of the fractional divider used in known generators is not of a stochastic, random type, but is deterministic and can thus be compensated.

In particular, since the delta-sigma modulation block that controls the fractional divider, in addition to generating the control signal of the fractional divider, also contains the information on the value of the quantization error, and in practice the latter is correlated to the phase error of the clock signal supplied by the fractional divider, this information can be used for compensating the jitter of the clock signal by delaying the corresponding switching edges.

Alternatively, in some embodiments, compensation of jitter may also be obtained using a sequence of delays of a preset value that increases until the division modulus of the fractional divider is modified.

In practice, in some embodiments, the clock generator does not act on the frequency of the signal, but regulates the phase of the single switching edges.

BRIEF DESCRIPTION OF THE DRAWINGS

For a better understanding of the present invention, and the advantages thereof, embodiments thereof are now described, purely by way of non-limiting examples, with reference to the attached drawings, wherein.

DETAILED DESCRIPTION OF ILLUSTRATIVE EMBODIMENTS

Figure 5:
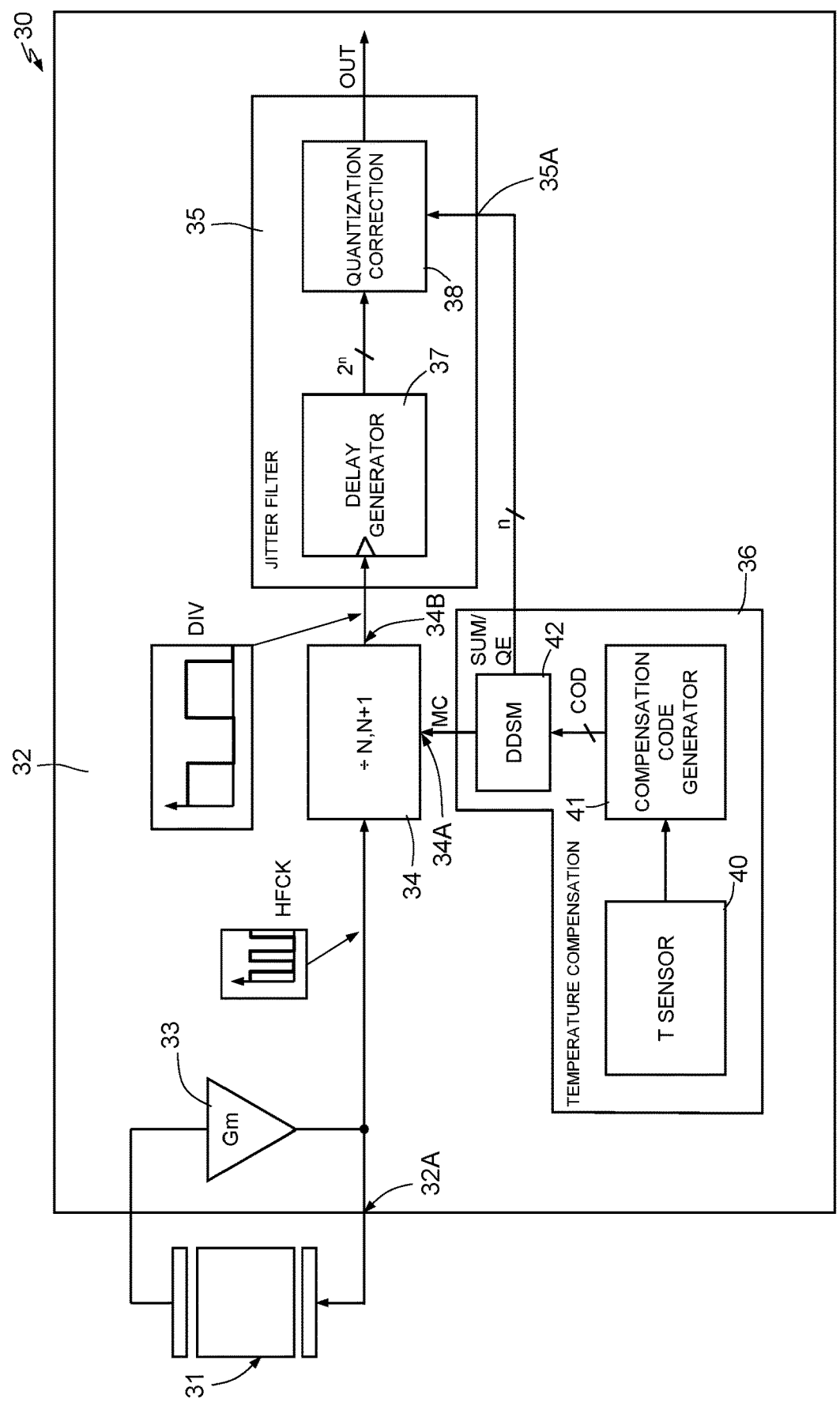
FIG. 5 shows a block diagram of the MEMS clock generator, according to an embodiment of the present invention.

FIG. 5 shows a simplified block diagram of a clock generator, designated as a whole by 30, according to an embodiment of the present invention.

The clock generator 30 comprises a resonant micromechanical structure 31 and an electronic processing circuit 32, coupled to the resonant micromechanical structure 31. For instance, the resonant micromechanical structure 31 and the electronic processing circuit 32 may be integrated in respective dice of semiconductor material, in particular silicon, and the dice may be accommodated in a same package.

The resonant micromechanical structure 31, of a MEMS type, comprises, in a per se known manner, not illustrated, a mobile structure, driving electrodes, and sensing electrodes. For instance, the mobile structure may be of the so-called "double-clamped" or "clamped-clamped" type, even though it is possible to also use other types of structures, either simpler or more complex ones.

The electronic processing circuit 32 comprises a current/voltage converter stage 33 having gain Gm, connected to the resonant micromechanical structure 31 at an input 32A and generating a high-frequency digital clock signal, hereinafter referred to as "resonant clock signal HFCK," having a frequency equal to the resonance frequency of the resonant micromechanical structure 31, for example approximately 524 kHz; a frequency divider 34, receiving the resonant clock signal HFCK and generating, at an output 34B, a divided clock signal DIV having, on average, a desired frequency (for example, approximately equal to 32 kHz); a jitter-suppression filter 35, connected to the output of the frequency divider 34 and generating an output clock signal OUT; and a temperature-compensation stage 36, generating a modulus-control signal MC supplied to a control input 34A of the frequency divider 34 and a quantization-error signal QE, supplied to a control input 35A of the jitter-suppression filter 35.

The temperature-compensation stage 36 may be formed in a known way and comprises, broadly, a temperature sensor 40, configured to measure the temperature of the resonant micromechanical structure 31 and outputting a temperature signal T; a compensation-code generator circuit 41, receiving the temperature signal T and generating an associated correction code COD, for example based on a stored table or via suitable computation structures; and a digital delta sigma modulator (DDSM) 42, generating the modulus-control signal MC and the quantization-error signal QE.

Figure 1:
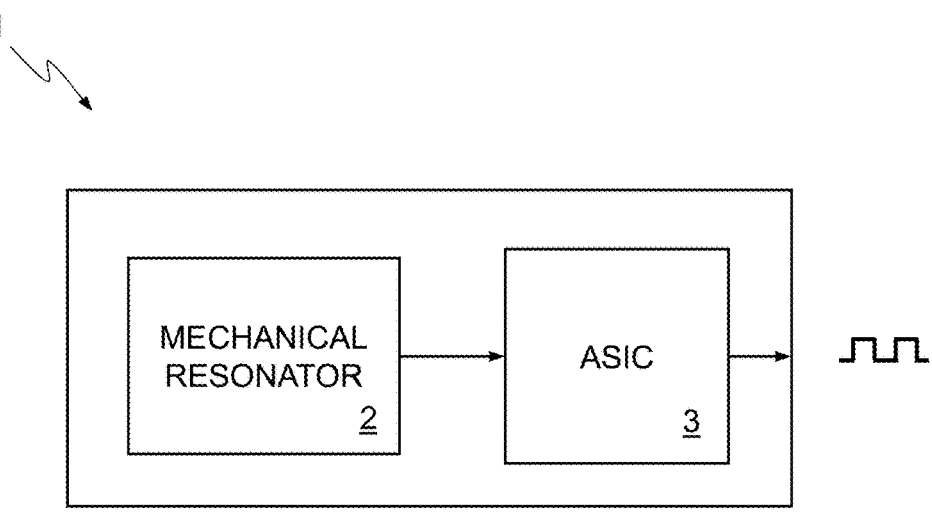
FIG. 1 is an extremely simplified block diagram of a clock generator based on a MEMS resonator.
Figure 2:
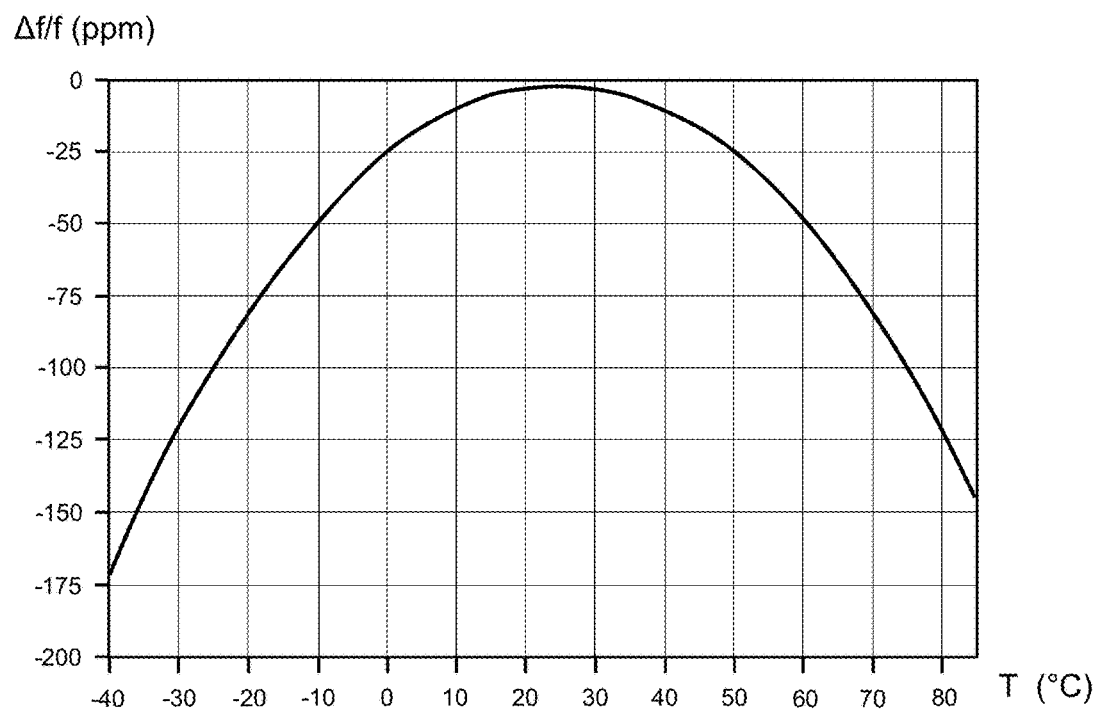
FIG. 2 shows the frequency variation of a MEMS clock generator as a function of temperature.
Figure 3:
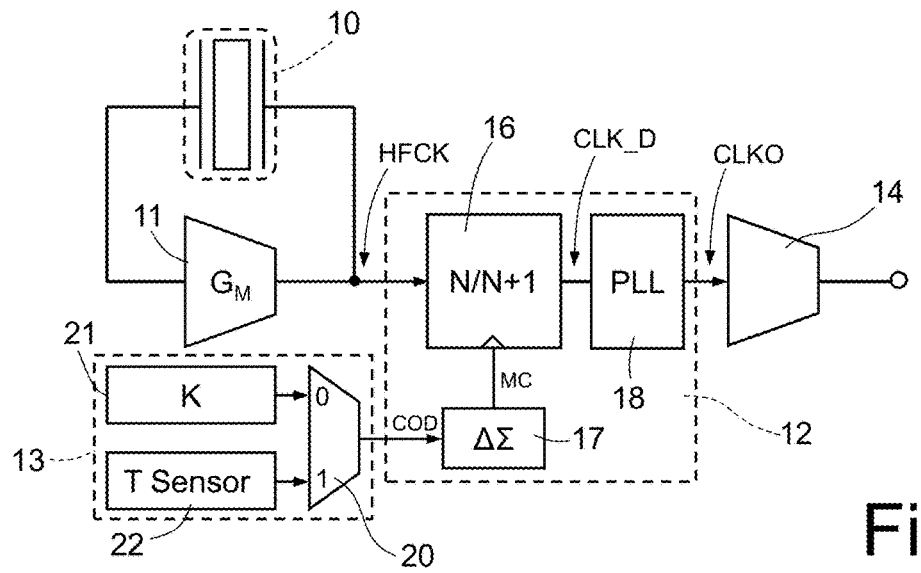
FIG. 3 shows a block diagram of a known MEMS clock generator having temperature correction.
Figure 4:
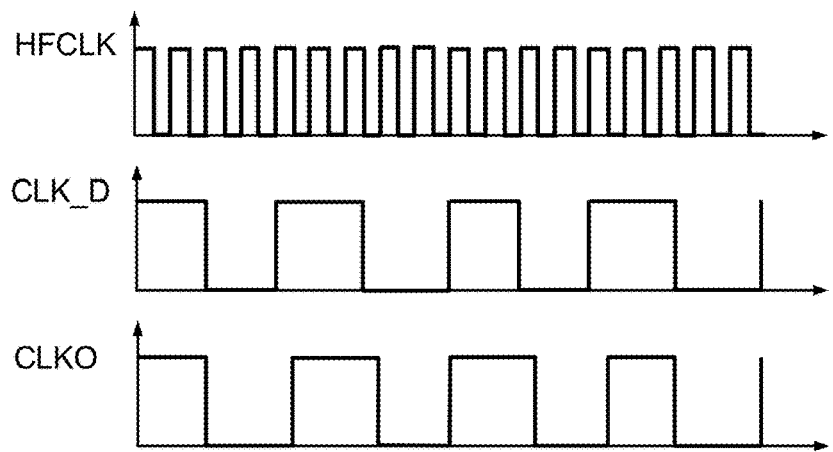
FIG. 4 shows an example of the plot of signals in the MEMS clock generator of FIG. 3.
Figure 6:
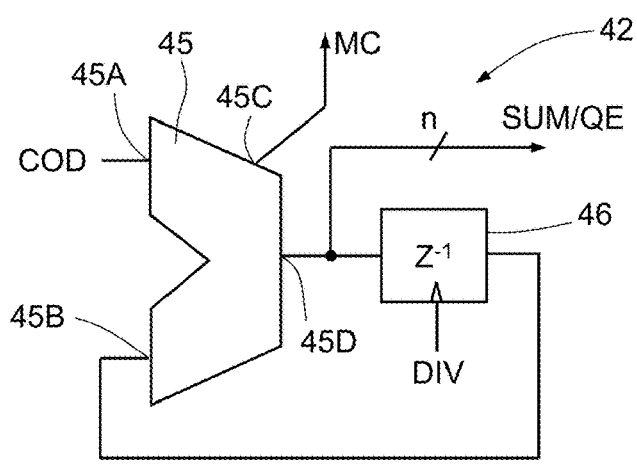
FIG. 6 shows a possible implementation of a block of the MEMS clock generator of FIG. 5, according to an embodiment of the present invention.

The delta-sigma modulator 42 may be made in a known way, for example as illustrated in FIG. 6 and described hereinafter, for a better understanding.

In detail, the delta-sigma modulator 42 of FIG. 6 comprises an adder 45 having a first input 45A receiving the correction code COD, a second input 45B receiving the output of a digital delay element 46, a first output 45C supplying the modulus-control signal MC, and a second output 45D supplying a sum signal SUM, which corresponds, as discussed hereinafter, to the quantization-error signal QE. (Consequently, hereinafter, the terms "sum signal SUM" or "quantization-error signal QE" will be used indifferently according to the context). The second output 45D of the adder 45 is connected to an input of the digital delay element 46, which thus supplies the sum signal SUM to the second input 45B of the adder 45.

In practice, the delta-sigma modulator 42 forms an integrator. The value (in binary code) of the sum signal SUM on the second output 45D represents the accumulation of the previous values of the correction code COD and is correlated, at each counting cycle, to the temporal deviation between the switching edge of the divided clock signal DIV and the corresponding switching edge of a nominal clock (not sensitive to variations with temperature and corresponding to an integer ratio between the frequency of the resonant signal HFCK and the frequency of the divided clock signal DIV). Consequently, the value of the sum signal SUM forms the temporal quantization error on the switching edges of the divided clock signal DIV, whereas the signal on the first output 45C (modulus-control signal MC) represents the overflow, i.e., when the quantization error reaches the preset maximum value and is to be corrected by modifying the division modulus of the fractional divider 34 of FIG. 5.

In some embodiments, in the clock generator, the value of the sum signal SUM is used for correcting the jitter. In particular, in some embodiments, the clock delay generators delays each switching edge of the divided clock signal DIV based on the value of the sum signal SUM, supplied to the jitter-suppression filter 35.

For a better understanding of operation of the jitter-suppression filter 35, reference is made also to FIGS. 7-8, described hereinafter.

Figure 7:
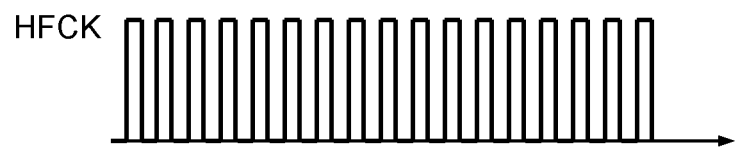
FIG. 7 shows an example of a behaviour of signals in the MEMS clock generator of FIG. 5 and in the block of FIG. 6, according to an embodiment of the present invention.
Figure 7:
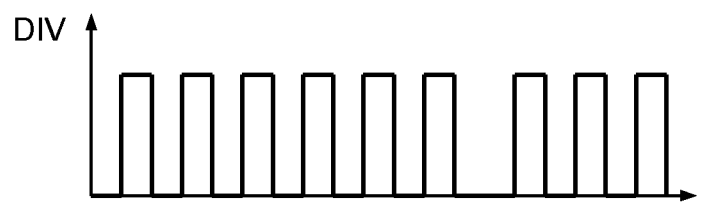
Figure 7:
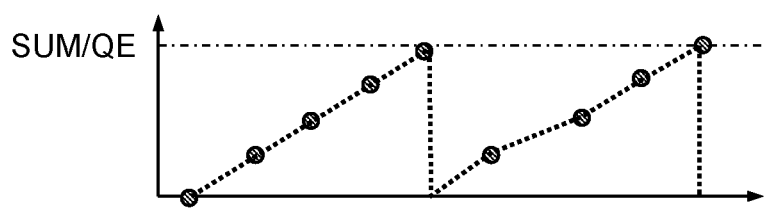
Figure 7:
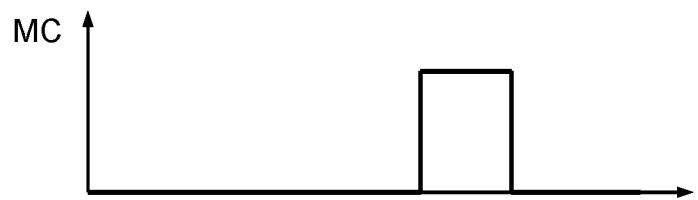
Figure 7:
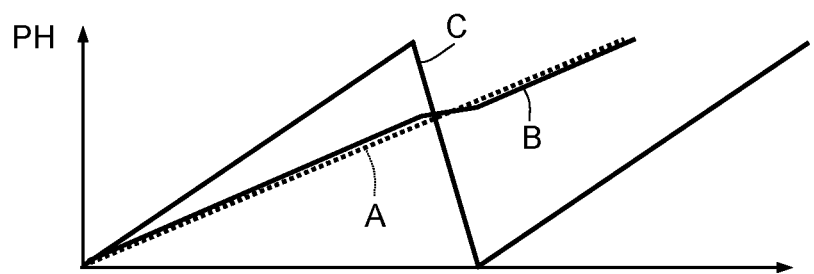

Initial reference may be made to FIG. 7, which represents the plot of some signals of the clock generator 30 of FIG. 5 and of correlated quantities.

In detail, FIG. 7 shows the succession of switching edges of the resonant clock signal HFCK and the corresponding sequence of switching edges of the divided clock signal DIV, which, for simplicity of illustration, derives from a division by 2 or 3 (N=2). In particular, initially (in the first six pulses of the divided clock signal DIV), a division by 2 is carried out; then (after the sixth clock pulse), the temperature-compensation stage 36 sets the division modulus to 3, which causes temporary lengthening of the period of the divided clock signal DIV.

In fact, the sum signal SUM, increased at each preset switching edge (for example, at the leading edge) of the divided clock signal DIV, here reaches its maximum value at the fifth switching edge and, upon receipt of the sixth switching edge, starts the count again. When this happens, the signal MC shows an overflow pulse.

FIG. 7 also shows the phase shift of the divided clock signal DIV with respect to a nominal situation. In particular, the curve A represents the nominal phase of a periodic signal, which is increasing linearly, without quantization error (nominal phase curve A), the curve B (real phase curve B) represents the phase of the divided clock signal DIV, which, as a result of the division by N, is slightly higher than the nominal value of the curve A, and the curve C represents the error due to difference between the real phase curve B and the nominal phase curve A, shown at an enlarged scale.

As may be noted, the real phase curve B increases more rapidly than the nominal phase curve A (phase advance) up to the time when the overflow pulse is generated in the modulus-control signal MC. Following the overflow pulse, the resonant clock signal HFCK is divided by N+1, and the divided clock signal DIV has a lengthened period. This corresponds to application of a phase delay, and the real phase curve B goes below the nominal phase curve A. After this correction, the real phase curve B starts to increase again faster than the nominal phase curve A.

Figure 8:
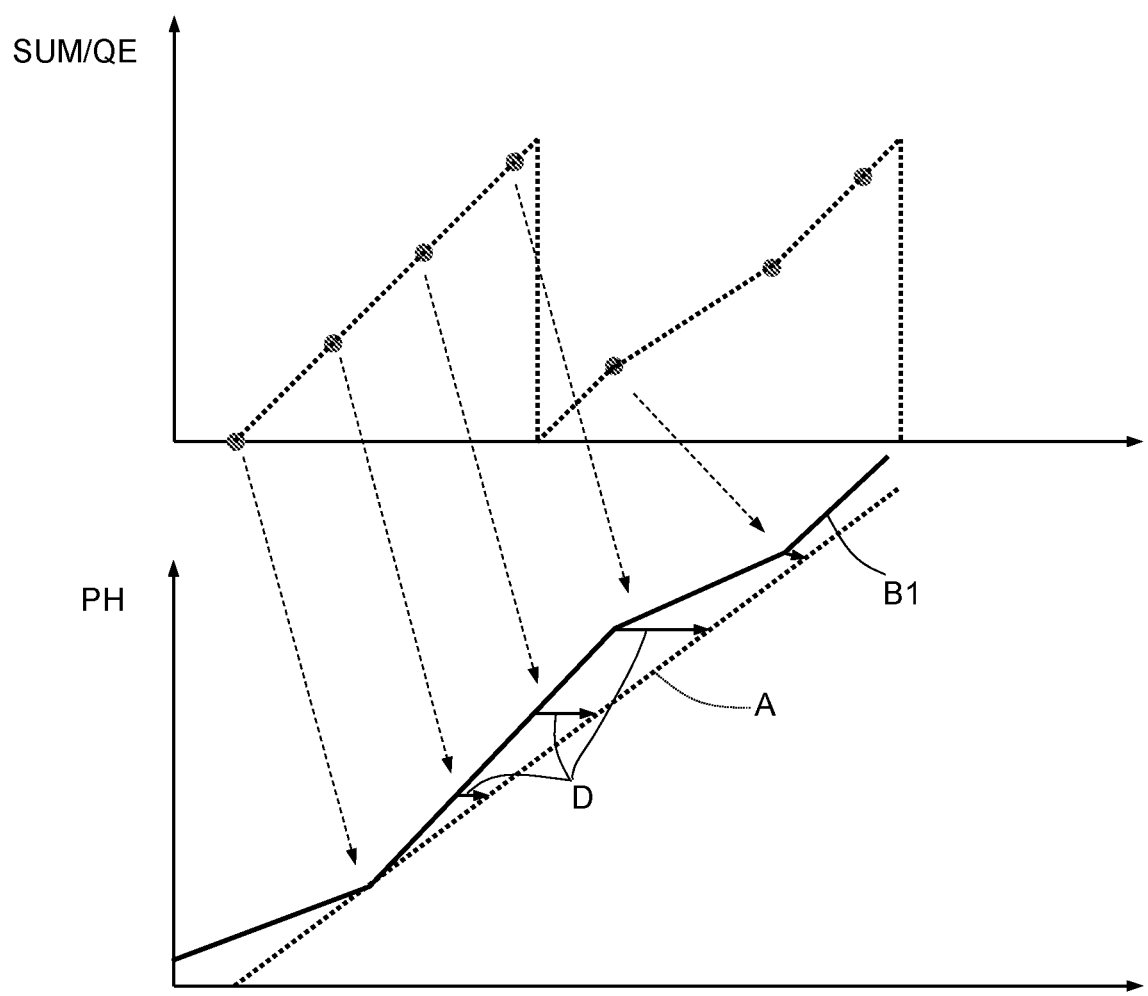
FIG. 8 shows a principle diagram of the method for correcting the jitter in the MEMS clock generator, according to an embodiment of the present invention.

The above behaviour is thus deterministic and enables a point-by-point phase correction of the divided clock signal DIV, as illustrated in FIG. 8.

FIG. 8 shows again the plot of the sum signal SUM and the shift between the nominal phase curve A and a different real phase curve B1, at an enlarged scale (here on the hypothesis that the correction always maintains the real phase in advance of the nominal phase and thus the real phase curve B1 is always to the left of the nominal phase curve A). FIG. 8 also represents the correspondence between the value of the sum signal SUM at each pulse of the divided clock signal DIV and the corresponding value of the real phase and shows, through the arrows D, the corresponding instantaneous error phase. Since the error phase is known and is the value, at the same time, of the sum signal SUM (quantization error QE), it may be corrected, at each cycle of the divided clock signal DIV by adding, to the real-phase curve B1 value, a delay equal to the quantization error.

To this end, with reference again to FIG. 5, the jitter-suppression filter 35 comprises a delay generator 37 and a delay selection block 38.

In particular, the delay generator 37 generates, with the same frequency of the divided clock signal DIV, a plurality of delayed pulses $\Phi[0], \Phi[1], \ldots, \Phi[i] \ldots, \Phi[k]$ and the delay selection block 38 selects at each clock pulse, as a function of the momentary quantization error QE, the appropriate delayed pulse $\Phi[i]$.

The output clock signal OUT is thus formed by a sequence of switching edges, each delayed, with respect to the corresponding switching edges of the divided clock signal DIV, by a value which compensates for the jitter.

Figure 9:
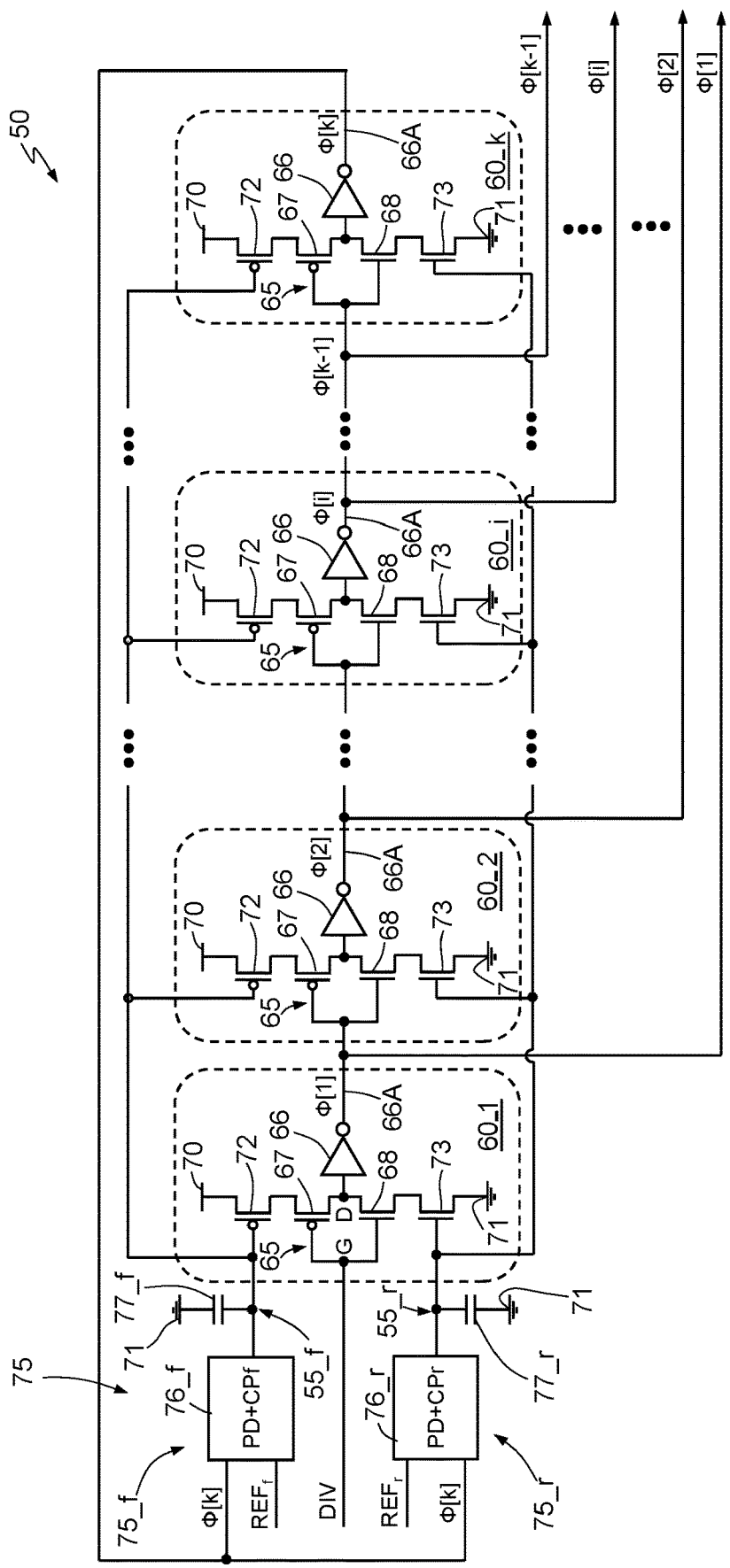
FIG. 9 shows a possible implementation of a block of the MEMS clock generator of FIG. 5, according to an embodiment of the present invention.

In particular, the delay-generator block 37 may be formed by a digital-to-time converter (DTC), for example by the DTC 50 of FIG. 9.

In particular, in the embodiment of FIG. 9, the DTC 50 comprises a plurality of delay stages $60\_1, 60\_2, \ldots, 60\_i, \ldots, 60\_k$, in sequence to each other and generating a respective delayed signal $\Phi[1], \Phi[2], \ldots, \Phi[i], \ldots, \Phi[k]$, each delayed by a unit delay $\tau$ with respect to the previous delay stage 60. The number of delay stages 60 is $k=2^n$, and the value of the unit delay $\tau$ is equal to a submultiple $1/2^n$ of the end-of-scale delay value, determined as explained hereinafter. (In the following, the index of the delay stages 60 and of the delayed signals Φ will appear only when it is necessary for understanding).

Each i-th delay stage 60_i comprises a first and a second inverter 65, 66, series connected to each other. In particular, the first inverter 65 is formed by a first PMOS transistor 67 and by a first NMOS transistor 68. The first PMOS transistor 67 and the first NMOS transistor 68 have drain terminals coupled together at a first node D coupled to the input of the second inverter 66; gate terminals coupled together at a second node G; and source terminals connected, respectively, to a supply line 70 and to a ground line 71 through a second PMOS transistor 72 and a second NMOS transistor 73, respectively.

The second node G of each delay stage 60_i forms an input of the same delay stage 60_i, connected to the output 66A of the second inverter 66 of the previous delay stage 60_i−1, except for the first delay stage (delay stage 60_1) which is directly coupled to the output of the frequency divider 34 and receives the divided clock signal DIV.

The outputs of the second inverters 66 of the delay stages 60_1, 60_2, ..., 60_i, ..., 60_k supply the delayed signals Φ[1], Φ[2], ..., Φ[i], ..., Φ[k]. Each delayed signal Φ[i] is then inputted to the respective subsequent delay stage 60_i+1 (not illustrated), ..., except for the last delayed signal Φ[k], which is fed back to the input of the delay-generator block 37, as described below.

The delay stages 60 are driven by a delay-regulation circuit 75 comprising a falling edge regulation branch 75f and a leading edge regulation branch 75r, similar to each other.

In detail, the falling edge regulation branch 75f comprises a first detector block 76f and a first capacitor 77f. The first detector block 76f is formed by a phase-detection and charge-pump circuit PD+CP, which receives at its input the last delayed signal Φ[k] and a first reference signal REF$_f$ and has a falling edge output 55f coupled to the gate terminals of the second PMOS transistors 72 of all the delay stages 60. The first capacitor 77f is coupled between the falling edge output 55f of the first detector block 76f and ground line 71.

Likewise, the leading edge regulation branch 75r comprises a second detector block 76r and a second capacitor 77r made in the same way and connected as the corresponding components of the falling edge regulation branch 75f. The second detector block 76f (also a phase-detection and charge-pump circuit PD+CP) inputs the last delayed signal Φ[k] and a second reference signal REF$_r$ and has a leading edge output 55r coupled to the gate terminals of the second NMOS transistors 73 of all the delay stages 60.

The phase-detection and charge-pump circuits PD+CP, 75r, 65f, configured in a known way, for example as described in the paper "A 17-mW Transmitter and Frequency Synthesizer for 900-MHz GSM Fully Integrated in 0.35-μm CMOS" by E. Hegati, IEEE Journal of Solid-State Circuits, vol. 38, No. 5, May 2003, calculate the phase difference between the respective input signals and supply, on the respective leading edge output 55r and falling edge output 55f, currents having a mean value equal to the detected phase differences. These currents enable conductivity control of the second PMOS transistor 72 and NMOS transistor 73, and regulation of the delay of the delay stages 60, as explained below.

The reference signals REF$_r$ and REF$_f$ (illustrated in FIG. 10) are signals having respective pulses of constant width, equal to the expected maximum delay (end-of-scale value, also referred to as "maximum delay time ΔT", as discussed below). Specifically, the first reference signal REF$_f$, acting on the falling edge of the delay signals Φ[i], has a low-to-high transition at the falling edge of the divided clock signal DIV and returns to low after the maximum delay time ΔT, whereas the second reference signal REF$_r$, acting on the leading edge of the delay signals Φ[i], has a high-to-low transition at the leading edge of the divided clock signal DIV and returns to high after the maximum delay time ΔT. The reference signals REF$_f$ and REF$_r$ are generated by a generator circuit (not illustrated) having just a few logic gates and made in an obvious way for the person skilled in the art, starting from the resonant signal HFCK based on the maximum delay time ΔT (equal to the end-of-scale value, as discussed below).

In practice, the leading edge regulation branch 75r and falling edge regulation branch 75f compare the phase of the respective switching edge of the last delayed signal Φ[k] with the analogous switching edge of the respective reference signal REF$_r$ and REF$_f$. For each regulation branch 75r and 75f, the compared switching edges are simultaneous in nominal conditions and in steady-state conditions, but generally differ upon start of the clock generator 30 (and thus of the DTC 50) and may have minor shifts as a result of the electronic noise and/or offset of the circuit.

In particular, at power up of the DTC 50, the shift between the respective switching edges and the last delayed signal Φ[k] is detected by the detector blocks 76f and 76r, each of which, independently and on the basis of the respective switching edge, outputs a current correlated to the detected shift; these currents charge the respective capacitors 77f, 77r, which thus generate control voltages Vf, Vr for the second PMOS transistors 72 and for the second NMOS transistors 73, respectively, of all the delay stages 60_i. The second PMOS transistors 72 and the second NMOS transistors 73 of the delay stages 60_i represent current-choking elements, which regulate the current supplied to the first inverter 65 of each delay stage 60_i based on the respective control voltage Vf, Vr and are appropriately sized. The first inverter 65 of each delay stage 60_i thus generates a delay, with respect to the input signal (divided clock signal DIV or delayed signal Φ[i−1] supplied by the previous delay stage 60_i−1) depending upon the sizing of the circuit and upon the phase shift detected by the detector blocks 76f and 76r.

In steady-state running conditions, the loop configuration of the DTC 50 causes the overall delay of the entire delay chain to be equal to ΔT, i.e., equal to the period of the resonant signal HFCK (in the example considered, 1/524 kHz~1.9 μs), and thus the delay generated by each delay stage 60_1 to be, to a first approximation, constant and equal to ΔT/k.

Figure 10:
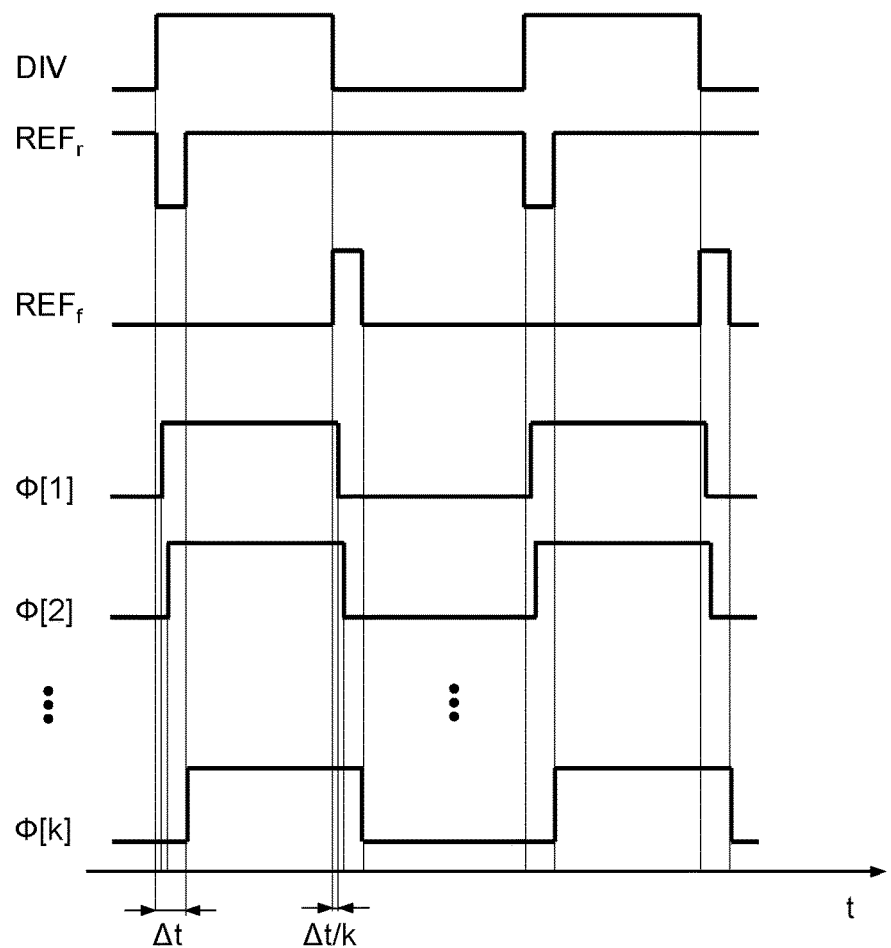
FIG. 10 shows the plot of signals in the block shown in FIG. 9, according to an embodiment of the present invention.

The above behaviour is visible in FIG. 10, which shows the divided clock signal DIV, the reference signals REF$_f$ and REF$_r$, and the delayed signals Φ[1], Φ[2], ..., Φ[i], ..., Φ[k] that can thus be obtained.

In practice, in the DTC 50 of FIG. 9, the delayed signals Φ[1], Φ[2], ..., Φ[k] have (in steady-state conditions and to a first approximation, neglecting any possible electronic noise and offset) a constant same period and duty cycle, and each of them has a different, increasing delay with respect to the divided clock signal DIV. The delay increase (hereinafter also referred to as unit delay) of each delayed signal Φ[1], Φ[2], ..., Φ[k] with respect to the previous delayed signal in the series is τ=ΔT/k.

For calculating the unit delay τ, and thus the number k of delay stages 60 to be provided for the design of the DTC 50, it is possible to proceed in the following way.

In the DTC 50, the number k=2$^n$ of delay stages 60, i.e., the number of bits necessary for delay quantization, is linked to the end-of-scale value FSR (referred to above also as maximum delay ΔT) and to the value of the least significant bit LSB (unit delay of each delay stage 60_$i$). The end-of-scale value is equal to the period $T_{osc}$ of the resonant signal HFCK, due to period lengthening of the divided clock signal DIV with respect to the period of the resonant signal HFCK by a factor N or N+1, so that the maximum temporal error committed on a single edge of the divided clock signal DIV is $T_{osc}$. The value of the least significant bit LSB is linked to the period quantization error σ, in a known way. It is possible to demonstrate that, for the considered clock generator 30, the period quantization error σ is equal, in the worst case, to one half of the value of the least significant bit LSB (σ=LSB/2).

From the relation $$LSB = \frac{FSR}{2^n}$$

where $2^n$ is the sought number of delay stages 60_$i$, in the considered application example, where $T_{osc}$=1/524 msec, and with a period quantization error σ of 30 ns (an acceptable value for an output clock signal OUT of 32 kHz), we obtain k=$2^n$=32 (n=5).

In practice, the DTC 50 forms a DLL (Delay Locked Loop) circuit.

The thus obtained delayed signals Φ[1], Φ[2], ..., Φ[i], ..., Φ[k−1] are supplied, together with the divided clock signal DIV, to the delay selection block 38, which selects, at each period of the divided clock signal DIV, and based on the sum signal SUM, the divided clock signal DIV or the delayed signal Φ[1], Φ[2], ..., Φ[i], ..., Φ[k−1] that has the corresponding delay value and outputs, at each period, the corresponding signal DIV, Φ[1], Φ[2], ..., Φ[i], ..., Φ[k−1] as output clock signal OUT. In this way, the output clock signal OUT comprises a series of clock pulses, each of which has a zero delay with respect to the divided clock signal DIV (in the case of the divided clock signal DIV, equivalent to Φ[0]) or a delay equal to that of the delayed signal Φ[1], Φ[2], ..., Φ[i], ..., Φ[k−1] selected each time, thus correcting the phase error in the way discussed with reference to FIG. 8.

Figure 11:
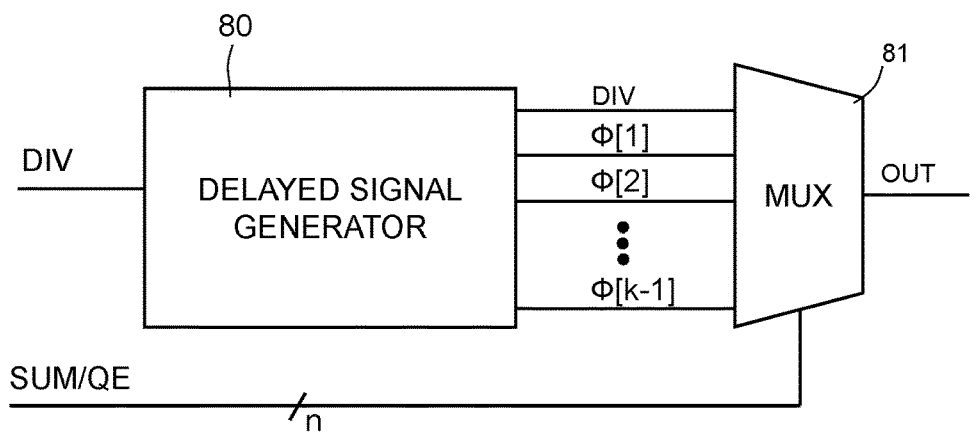
FIG. 11 shows a possible implementation of another block of the MEMS clock generator of FIG. 5, according to an embodiment of the present invention.

For instance, in FIG. 11, the delay selection block 38 is formed by a multiplexer 80, having a control input that receives the sum signal SUM and data inputs that receive the divided clock signal DIV and the delayed signals Φ[1], Φ[2], ..., Φ[k−1].

As an alternative to the above, the delay selection block 38 could receive all the delayed signals Φ[1], Φ[2], ..., Φ[i], ..., Φ[k] (but not the divided clock signal DIV) and select, at each period of the divided clock signal DIV, the one specified by the sum signal SUM.

The clock generator 30 and the jitter-compensation method described herein have numerous advantages.

In particular, the jitter filter 35, operating to compensate the phase error on the individual switching edges of the divided clock signal DIV, requires just a few passive components of small dimensions, so that the area required for its integration is limited.

The portion of the jitter filter 35 that works at high frequency (frequency of the resonant signal HFCK) and thus consumes quite a lot of energy is very small (in practice, only the few logic gates generating the reference signals REF_$f$ and REF_$r$, as explained above). Consequently, the present clock generator has low consumption levels.

Unlike the majority of known DLL circuits, the present jitter filter uses input signals (reference signals REF_$r$ and REF_$f$) having a duty cycle much lower than 50%. Also for this reason, a significant power saving is obtained as compared to known solutions.

Compensation of jitter by introducing, on the switching edges of the divided clock signal DIV, a delay linked to the value of the sum signal SUM of the temperature-compensation stage 36 (quantization error QE) makes it possible to adapt the same delay to temperature variations, enabling an accurate compensation at all the operating temperatures.

The clock generator and the jitter filter described herein moreover have a high stability.

Finally, it is clear that modifications and variations may be made to the clock generator and the jitter-compensation method described and illustrated herein, without thereby departing from the scope of the present invention, e.g., as defined in the attached claims.

For instance, the structure of the delay stages 60 may be different and each may comprise a respective unit-delay element (for example, a capacitor) for appropriately delaying the switching edges of the divided clock signal DIV.

According to another embodiment, the DTC 50 may generate, instead of a series of pulses with different delays that are selected by the multiplexer 80, a series of delay pulses having an increasing width which is a multiple of a unit delay (and corresponding to the duration of the least significant bit LSB), which are subtracted from/added to the divided clock signal DIV so as to modify the switching edges thereof, on the basis of the momentary quantization error.

Even though the DTC 50 has two different branches, the leading edge regulation branch 75$r$ and the falling edge regulation branch 75$f$, it is possible to have just one regulation branch (associated to just one of the switching edges, for example the leading edge) that corrects a single unit delay at each period of the jitter filter 35 and controls both the choking transistors 72_$r$, 72_$f$, for example through a current mirror.

According to a different embodiment, compensation of jitter may also be obtained automatically, at each period of the divided clock signal, by applying an increasing delay (up to a maximum, coinciding with the change of modulus from N to N+1) using a sequence of delays of preset value.

What is claimed is:

1. A clock generator comprising:
   a signal input configured to receive a high-frequency clock signal;
   a variable-modulus frequency divider coupled to the signal input and having a control input and an output, wherein the control input of the variable-modulus frequency divider is configured to receive a modulus-control signal, and wherein the output of the variable-modulus frequency divider is configured to supply a divided clock signal having a jitter;
   a temperature-compensation circuit configured to generate the modulus-control signal; and
   a jitter filter coupled to the variable-modulus frequency divider and configured to:
      receive the divided clock signal, and
      generate a compensated clock signal having switching edges that are delayed, with respect to the divided clock signal, by a time correlated to the jitter.

2. The clock generator of claim 1, wherein the temperature-compensation circuit is configured to generate a quantization-error signal, and wherein the jitter filter is coupled to the temperature-compensation circuit and is configured to:
receive the quantization-error signal; and
delay the switching edges of the compensated clock signal by a time correlated to a value of the quantization-error signal.

3. The clock generator of claim 2, wherein the jitter filter comprises:
a delay generator configured to receive the divided clock signal and to generate a plurality of delayed clock signals, each of the plurality of delayed clock signals having a different delay with respect to the divided clock signal; and
a selection circuit configured to receive the plurality of delayed clock signals and the quantization-error signal and configured to periodically select one of the delayed clock signals.

4. The clock generator of claim 3, wherein the delay generator is a delay locked loop (DLL) circuit.

5. The clock generator of claim 3, wherein the selection circuit is a multiplexer.

6. The clock generator of claim 3, wherein the delay generator comprises a plurality of delay stages cascade-coupled to each other, wherein a first delay stage of the plurality of delay stages is configured to receive the divided clock signal, and wherein each delay stage of the plurality of delay stages has an output configured to supply a respective delayed clock signal.

7. The clock generator of claim 6, wherein each delay stage of the plurality of delay stages comprises first and second inverters cascade-coupled to each other.

8. The clock generator of claim 7, wherein the delay generator comprises a delay-regulation circuit configured to receive a first delayed clock signal from among the delayed clock signals and a reference signal and configured to generate electrical regulation quantities, and wherein the first inverter of each delay stage is coupled to first and second reference voltage lines through first and second current-choking elements, respectively, each of the first current-choking elements having respective control terminals coupled together, and each of the second current-choking elements having respective control terminals coupled together, the first and second current-choking elements being coupled to the delay-regulation circuit and having a conductivity controlled by the electrical regulation quantities.

9. The clock generator of claim 8, wherein the first and second current-choking elements are metal-oxide semiconductor (MOS) transistors.

10. The clock generator of claim 8, wherein the delay-regulation circuit has an input coupled to a last delay stage of the plurality of delay stages.

11. The clock generator of claim 8, wherein the delay-regulation circuit comprises a leading edge regulation branch and a falling edge regulation branch, wherein the falling edge regulation branch is configured to receive the first delayed clock signal and a falling edge reference signal, the falling edge regulation branch having an output coupled to the control terminals of the first current-choking elements, wherein the leading edge regulation branch is configured to receive the first delayed clock signal and a leading edge reference signal, the leading edge regulation branch having an output coupled to the control terminals of the second current-choking elements.

12. The clock generator of claim 11, wherein the leading edge regulation branch and the falling edge regulation branch each comprise a respective phase-detection and charge-pump circuit and a respective capacitor.

13. A method for generating a jitter-compensated clock signal in a clock generator, the method comprising:
receiving a high-frequency clock signal;
generating a modulus-control signal based on a temperature value;
dividing the high-frequency clock signal based on the modulus-control signal to generate a divided clock signal having a jitter; and
delaying switching edges of the divided clock signal by a time correlated to the jitter to generate a compensated clock signal.

14. The method of claim 13, wherein delaying switching edges of the divided clock signal comprises:
generating a quantization-error signal;
generating a plurality of delayed clock signals, each having a different delay with respect to the divided clock signal; and
periodically selecting one of the delayed clock signals based on the quantization-error signal.

15. The method of claim 14, wherein generating the plurality of delayed clock signals comprises:
receiving the divided clock signal; and
delaying the divided clock signal by a series of delay stages cascade-coupled to each other, each delay stage generating a respective delayed clock signal having a delay with respect to a previous delayed clock signal.

16. The method of claim 14, wherein the plurality of delayed clock signals comprises a maximum delay delayed clock signal, the method further comprising:
comparing the maximum delay delayed clock signal with a reference signal; and
regulating a delay value of each delayed clock signal based on a difference between the maximum delay delayed clock signal and the reference signal.

17. The method of claim 13, further comprising generating the high-frequency clock signal with a resonant microelectromechanical structure of a microelectromechanical system (MEMS) type.

18. A clock generator comprising:
a variable-modulus frequency divider comprising:
a first input configured to receive a high-frequency clock signal,
a second input configured to receive a modulus-control signal that is based on a temperature value, and
an output, wherein the variable-modulus frequency divider is configured to generate, at the output of the variable-modulus frequency divider, a divided clock signal having a target average clock frequency and a jitter; and
a jitter filter comprising:
a first input configured to receive the divided clock signal,
a second input configured to receive the modulus-control signal, and
an output, wherein the jitter filter is configured to generate, at the output of the jitter filter, a compensated clock signal having the target average clock frequency and a compensated jitter by delaying switching edges of the divided clock signal by a time correlated to the jitter based on the modulus-control signal.

19. The clock generator of claim 18, wherein the jitter filter further comprises:
a delay generator having an input coupled to the first input and configured to generate a plurality of delayed clock signals, wherein each of the plurality of delayed clock signals has a different delay with respect to the divided clock signal; and a selection circuit configured to:
 receive the plurality of delayed clock signals,
 receive an error signal, and
 periodically select one of the delayed clock signals based on the error signal.

20. The clock generator of claim 19, further comprising a temperature compensation stage having a temperature sensor and a digital delta-sigma modulator, wherein the digital delta-sigma modulator is configured to generate the modulus-control signal and the error signal.

* * * * *